(12) United States Patent
Lin et al.

(10) Patent No.: US 11,369,023 B2
(45) Date of Patent: Jun. 21, 2022

(54) COMPOSITE LCP HIGH-FREQUENCY HIGH-SPEED DOUBLE-SIDED COPPER FOIL SUBSTRATE AND PREPARATION METHOD THEREOF

(71) Applicant: Kunshan Aplus Tec. Corporation, Kunshan (CN)

(72) Inventors: Chihming Lin, Kunshan (CN); Weichih Lee, Kunshan (CN); Chienhui Lee, Kunshan (CN)

(73) Assignee: KUNSHAN APLUS TEC. CORPORATION, Kunshan (CN)

( * ) Notice: Subject to any disclaimer, the term of this patent is extended or adjusted under 35 U.S.C. 154(b) by 112 days.

(21) Appl. No.: 15/856,057

(22) Filed: Dec. 28, 2017

(65) Prior Publication Data

US 2018/0332710 A1   Nov. 15, 2018

(30) Foreign Application Priority Data

May 10, 2017   (CN) .......................... 201710324895.8

(51) Int. Cl.
*H05K 3/02*   (2006.01)
*H05K 1/09*   (2006.01)
(Continued)

(52) U.S. Cl.
CPC ............. *H05K 3/022* (2013.01); *H05K 1/024* (2013.01); *H05K 1/028* (2013.01); *H05K 1/036* (2013.01);
(Continued)

(58) Field of Classification Search
CPC ........ H05K 3/022; H05K 1/028; H05K 1/024; H05K 1/036; H05K 1/09; H05K 2201/015;
(Continued)

(56) References Cited

U.S. PATENT DOCUMENTS

| 6,346,598 B1 * | 2/2002 | Hashimoto ............. B32B 15/14 525/464 |
| 2011/0114371 A1 * | 5/2011 | Lin ........................... B32B 7/12 174/254 |

(Continued)

FOREIGN PATENT DOCUMENTS

| CN | 201590948 U | 9/2010 |
| CN | 202276545 U | 6/2012 |

(Continued)

*Primary Examiner* — Anthony J Frost
(74) *Attorney, Agent, or Firm* — Bayramoglu Law Offices LLC

(57) ABSTRACT

The invention discloses a composite LCP high-frequency high-speed double-sided copper foil substrate, which includes at least one LCP core layer, at least one extremely low dielectric adhesive layer, and two copper foil layers. The LCP core layer and the extremely low dielectric adhesive layer are located between the two copper foil layers. The invention has not only good electrical performance but also low roughness, stable dk/df performance in high temperature and humid environment, ultra-low water absorption, good UV laser drilling ability, low spring force suitable for high density assembly, and excellent mechanical properties. Besides, in current technology, only a thickness limited to a maximum of about 50 μm can be obtained in the coating method. In the preparation method of the invention, a substrate having a thickness of 100 μm or more can be easily obtained.

13 Claims, 1 Drawing Sheet

(51) Int. Cl.
*H05K 1/03* (2006.01)
*H05K 1/02* (2006.01)
*B32B 15/20* (2006.01)
*B32B 15/01* (2006.01)
*B32B 37/12* (2006.01)
*B32B 38/00* (2006.01)
*B32B 37/02* (2006.01)
*B32B 7/12* (2006.01)

(52) U.S. Cl.
CPC ............... *H05K 1/09* (2013.01); *B32B 7/12* (2013.01); *B32B 15/01* (2013.01); *B32B 15/20* (2013.01); *B32B 37/02* (2013.01); *B32B 37/12* (2013.01); *B32B 38/00* (2013.01); *B32B 2255/06* (2013.01); *B32B 2255/26* (2013.01); *B32B 2457/08* (2013.01); *H05K 2201/015* (2013.01); *H05K 2201/0141* (2013.01); *H05K 2201/0154* (2013.01); *H05K 2201/0195* (2013.01)

(58) Field of Classification Search
CPC ... H05K 2201/0195; H05K 2201/0141; H05K 2201/0154; B32B 2255/26; B32B 2255/06; B32B 2457/08; B32B 38/00; B32B 37/12; B32B 37/02; B32B 15/20; B32B 15/01; B32B 7/12
See application file for complete search history.

(56) References Cited

U.S. PATENT DOCUMENTS

| | | | | |
|---|---|---|---|---|
| 2012/0037410 | A1* | 2/2012 | Amou | B32B 7/12 |
| | | | | 174/258 |
| 2013/0316170 | A1* | 11/2013 | Uchiyama | C09J 175/14 |
| | | | | 428/344 |
| 2016/0137890 | A1* | 5/2016 | Li | C09J 171/12 |
| | | | | 523/451 |
| 2016/0148719 | A1* | 5/2016 | Yin | C08L 71/12 |
| | | | | 524/119 |
| 2016/0303829 | A1* | 10/2016 | Arai | B32B 15/08 |

FOREIGN PATENT DOCUMENTS

| | | | | |
|---|---|---|---|---|
| CN | 103096612 | * | 5/2013 | ............... H05K 1/02 |
| CN | 103096612 B | | 7/2015 | |
| CN | 201710085366.7 | | 2/2017 | |
| JP | 3165576 U | | 1/2011 | |
| TW | M377823 U1 | | 4/2010 | |
| TW | M422159 U1 | | 2/2012 | |
| TW | M531056 U | | 10/2016 | |

* cited by examiner

COMPOSITE LCP HIGH-FREQUENCY HIGH-SPEED DOUBLE-SIDED COPPER FOIL SUBSTRATE AND PREPARATION METHOD THEREOF

CROSS REFERENCE TO RELATED APPLICATIONS

This application is based upon and claims priority to Chinese Patent Application No. CN201710324895.8, filed on May 10, 2017, the entire content of which is incorporated herein by reference.

TECHNICAL FIELD

The present invention relates to the technical field of double-sided copper foil substrates for FPC (Flexible Printed Circuit) and the preparation method thereof, particularly to a composite LCP high-frequency high-speed double-sided copper foil substrate.

BACKGROUND

With the rapid development of information technology, in order to achieve high-frequency high-speed signal transmission, rapid thermal conductivity, and to minimize production cost, various types of mixed-structure multi-layer board designs and applications have been developed. Printed circuit boards are necessary material for electronics, and the demand for printed circuit boards is also increasing with growth in the demand for consumer electronics. The flexible printed circuit board (FPC, Flexible Printed Circuit) has the features of flexibility, three-dimensional space wiring, and so on. The flexible printed circuit boards are widely used in computers and its peripherals, communication products and consumer electronic products under development trend that electronic products are becoming more and more light, short, flexible, high-frequency.

In the high-frequency field, the wireless infrastructure needs to provide a sufficiently low insertion loss to effectively improve energy efficiency. With the rapid development of 5G communication, millimeter wave, aerospace industry, and defense industry, the upcoming demand of high-frequency high-speed FPC (flexible circuit board)/PCB (printed circuit board) and with the emergence of large data, Internet of things and other emerging industries and popularization of the mobile internet terminals, quickly processing and sending information has become the focus of the communication industry. In the field of communications, 5G network will have larger bandwidth, denser micro-base station construction, faster network speed than 4G in future. To meet the demand of the Internet of things and the cloud computing and broadband communications in the new era, the development of high-speed servers and the mobile phones having higher transmission speed has become a market requirement. In general, FPC/PCB is the main bottleneck in the entire transmission process. If there is no good design or the relevant materials with good electrical properties, the transmission will be seriously delayed, causing signal loss. This leads to a high demand for circuit board materials. In addition, the high-frequency substrates mainly used in current industry are the LCP (liquid crystal polymer) plates, or PTFE (Polytetrafluoroethylene) fiberboards. However, these substrates are limited by the process technology, which has a high requirement for device and further needs to operate at a high temperatures (>280° C.), leading to uneven thickness of the film. In addition, the uneven thickness of the film makes it hard to control the circuit board impedance. Besides, the quick press equipment cannot be used, resulting in difficulties in processing. Other resin films do not have the above problems, but they have issues like poor electrical resistance, weak bonding force, poor mechanical strength, etc.

Composite substrate not only has excellent performance, but also has characteristics of excellent workability, low cost, and low energy consumption. This structure is mentioned in the Chinese utility model patent "double-sided copper foil substrate" (CN201590948U) and patent "a composite double-sided copper foil substrate and the flexible printed circuit board structure using the substrate, Taiwanese patent (M377823), Japanese patent (JP2010-7418A), and US patent application (US2011/0114371). In a patent "high-frequency substrate structure" (utility model CN 202276545U/invention CN 103096612B, TW M422159) and another patent "high-frequency substrate structure" (TW M531056), the structure is used with fluorine-based materials, powders or other high-frequency materials to prepare a high-frequency substrate. In the patent application ("PI type high-frequency high-speed transmission double-sided copper foil substrate and preparation method thereof, application number 201710085366.7"), composite structure substrate using polyimide core layer together with a low dielectric adhesive layer is also mentioned.

When used in the downstream industry, normal epoxy resin products perform badly in small pore size (less than 100 um) UV laser process, causing hole shrinkage in plating through-holes (PTH, Plating Through Hole). Therefore, normal epoxy resin products are only suitable for large pore size mechanical drilling method.

In the preparation of multilayer boards and rigid-flex boards, the high hygroscopicity (1-2%) of the general polyimide (PI) type and TPI-type copper foil substrate will cause delamination, which seriously affects the yield rate.

In terms of cost, performance and workability, when LCP, TPI (thermosetting polyimide) method is used to prepare high-frequency substrates, high temperature pressing at a pressuring temperature between 280-330° C. is required during the manufacturing. Especially, during the production of the products having good transmission performance and the thickness of 38 μm or more, the efficiency is low and the cost is high.

SUMMARY OF THE INVENTION

The technical problem that the present invention mainly solves is to provide a composite LCP high-frequency high-speed double-sided copper foil substrate. The present invention has not only good electrical performance, but also low roughness, stable dk/df performance at high temperatures and in humid environment, extremely low water absorption, excellent UV laser drilling capacity, low spring force suitable for high density assembly, and excellent mechanical properties. In addition, for the coating method, in the current technology, only about 50 μm thickness can be applied. However, by using the preparation method of the present invention, the substrate having a thickness of 100 μm or more can be easily obtained.

In order to solve the above technical problems, a technical solution of the present invention is to provide a composite LCP high-frequency high-speed double-sided copper foil substrate, including at least one LCP core layer, at least one extremely low dielectric adhesive layer, and two copper foil layers.

The LCP core layer and the extremely low dielectric adhesive layer are located between the two copper foil layers.

The thickness of each LCP core layer is 5-50 μm; the thickness of each of the extremely low dielectric adhesive layer is 2-50 μm; the thickness of each of copper foil layer is 1-35 μm.

Preferably, the thickness of each LCP core layer is 12.5-50 μm; the thickness of each extremely low dielectric adhesive layer is 12.5-50 μm; the thickness of each copper foil layer is 6-181 μm.

Further, the double-sided copper foil substrate has one of the following two structures.

The first structure comprises a LCP core layer, an extremely low dielectric adhesive layer, a first copper foil layer, and a second copper foil layer, the LCP core layer is located between the first copper foil layer and the extremely low dielectric adhesive layer, the extremely low dielectric adhesive layer is located between the second copper foil layer and the LCP core layer; a total thickness of the LCP core layer, the extremely low dielectric adhesive layer, the first copper foil layer, and the second copper foil layer is 9-170 μm.

The second structure comprises a first LCP core layer, an extremely low dielectric adhesive layer, a second LCP core layer, a first copper foil layer, and a second copper foil layer; the first LCP core layer is located between the first copper foil layer and the extremely low dielectric adhesive layer, the extremely low dielectric adhesive layer is located between the first LCP core layer and the second LCP core layer, the second LCP core layer is located between the extremely low dielectric adhesive layer and the second copper foil layer; a total thickness of the first LCP core layer, the extremely low dielectric adhesive layer, the second LCP core layer, the first copper foil layer, and the second copper foil layer is 14-220 μm.

Further, the extremely low dielectric adhesive layer is an adhesive layer having a Dk value of 2.0 to 3.0 (10 GHz) and a Df value of 0.002 to 0.010 (10 GHz).

Preferably, the extremely low dielectric adhesive layer is an adhesive layer having a Dk value of 2.2 to 3.0 (10 GHz).

Further, each of the copper foil layer is a low-profile copper foil layer having an Rz value of 0.4 to 0.0 μm, and the Rz value of a surface of the copper foil layer attached to the LCP core layer is 0.4 to 1.0 μm, and the Rz value of an outer surface of the copper foil layer is 0.4 to 0.7 μm. Each copper foil layer is a rolled copper foil layer or an electro deposited copper layer.

Further, a water absorption of the LCP core layer is 0.01-0.1%; a water absorption of the extremely low dielectric adhesive layer is 0.01-0.1%; an overall water absorption of the double-sided copper foil substrate is 0.01-0.5%, and a bonding strength of the extremely low dielectric adhesive layer is more than 0.7 kgf/cm$^2$.

Furthermore, the water absorption of the LCP core layer is 0.01-0.04%; the water absorption of the extremely low dielectric adhesive layer is 0.01-0.08%; an overall water absorption of the double-sided copper foil substrate is 0.01-0.1%.

Further, resin material of the extremely low dielectric adhesive layer is at least one selected from the group consisting of fluorine-based resin, epoxy resin, acrylic resin, amine-based formate-based resin, silicone rubber-based resin, poly-p-xylene based resin, bismaleimide-based resin, and polyimide resin.

Further, the extremely low dielectric adhesive layer comprises fused silicon dioxide, teflon, fluorine-based resin, phosphorus-based heat-resistant agent and polyimide resin; and the sum proportion of fused silicon dioxide, teflon, fluorine-based resin, phosphorus-based heat-resistant agent relative to total solid content is 8 to 50% by weight; a proportion of the polyimide resin is 40 to 90% by weight.

Further, the fused silicon dioxide is 2 to 15% of total solid content by weight, the teflon is 2 to 10% of total solid content by weight, the fluorine-based resin is 2 to 10% of total solid content by weight, the phosphorus-based heat-resistant agent is 2 to 15% of total solid content by weight.

The present invention further provides a preparation method of the composite LCP high-frequency high-speed double-sided copper foil substrate. The preparation method is one of the following two methods.

The first method comprises the following steps:

step 1: coating a LCP varnish on one side of the first copper foil layer, and then removing a solvent at 60-100° C., and then conducting condensation reaction at 300° C. for 10 hours to generate the LCP core layer;

step 2: coating an extremely low dielectric adhesive on a surface of the LCP core layer, and drying to obtain an extremely low dielectric adhesive layer;

step 3: pressing the second copper foil layer on a surface of the extremely low dielectric adhesive layer; and step 4: conducting winding and curing to obtain a finished product.

The second method comprises the following steps:

step 1: coating the LCP varnish on one side of the first copper foil layer, and then removing the solvent at 60-100° C., and then conducting condensation reaction at 300° C. for 10 hours to generate a first LCP core layer;

step 2: coating an extremely low dielectric adhesive on a surface of the first LCP core layer, and drying to obtain an extremely low dielectric adhesive layer;

step 3: coating the LCP varnish in the step 1 on the extremely low dielectric adhesive layer, and then removing the solvent at 60-100° C., and then conducting condensation reaction at 300° C. for 10 hours to generate a second LCP core layer;

step 4: pressing the second copper foil layer on a surface of the second LCP core layer, and step 5: conducting winding and curing to obtain a finished product.

The present invention has the following advantages. The present invention includes at least one LCP core layer, at least one extremely low dielectric adhesive layer, a first copper foil layer, and a second copper foil layer. Therefore, the present invention has reasonable structure and at least has the following advantages.

1. The copper foil layer used in the present invention is a low-profile foil layer, which has a skin effect in the signal transmission. Since the surface roughness of the copper foil is low, the crystal is fine, and the surface flatness is excellent, the high-speed transmission can be achieved. At the same time, the extremely low dielectric layer with low and stable Dk/Df performance can reduce the loss in signal transmission and further improve the signal transmission quality and can meet the requirements of high-frequency and high-speed FPC, rapid thermal conductivity and minimized production cost in its development.

2. Since the components of the extremely low dielectric adhesive layer in the present invention contains a polyimide resin, a fused silicon dioxide, a teflon, a fluorine-based resin, and a phosphorus-based heat-resistant agent, the extremely low dielectric adhesive layer has a low water absorption. Thus, the present invention has a Dk/Df value that is extremely low, stable in a high-temperature and humid environment, thereby making the present invention suitable for rapid pressing at a low temperature (lower than 180° C.), resulting in a good processing ability and a low requirement to the manufacture equipment, and reducing the production cost. The equipment operating and processing ability of the present invention is superior to the existing LCP substrates and PTFE fiberboards. More preferably, because the present invention is suitable for low temperature pressing, the line oxidation risk in the preparation process of FPC line is greatly reduced.

3. The extremely low dielectric adhesive layer of the present invention can be a polyimide resin layer. Since the structure of a polyimide resin together with a LCP core layer is used, the present invention is more suitable for downstream small pore size (<100 μm) UV laser processing, compared with the conventional epoxy resin product. As a result, it is not easy to cause plating through hole (PTH, Plating Through Hole) or hole shrinkage, and the film thickness is uniform when pressing is conducted, and impedance control is excellent. Therefore, it is not only suitable for larger pore size drilling processing methods but also has a good process adaptability.

4. Compared with the conventional LCP plate, the present invention has a low spring force and is suitable for downstream high-density assembly process.

5. The present invention has a LCP core layer, and the extremely low dielectric adhesive layer contains a polyimide resin, a fused silicon dioxide, a teflon, a fluorine-based resin, and a phosphorus-based heat-resistant agent. Since the raw materials have low water absorption, the overall water absorption of the present invention is in the range of 0.01 to 0.5%, or even less than 0.1%. Due to the extremely low water absorption, the performance of the present invention after water absorption is stable and has excellent electrical properties, which greatly reduces the delamination risk of the multi-layer board and the rigid-flex board, and reduce the insertion loss of the signal transmission.

6. The present invention also has the advantages of good thermal expansion, good flexibility, high solder resistance, and excellent mechanical properties. The extremely low dielectric adhesive layer has excellent bonding strength, which is more than 0.7 kgf/cm.

7. The temperature of the press section of the present invention is 50-130° C., which greatly reduces the energy consumption and cost and improves the workability. Not only the composite LCP high-frequency high-speed double-sided copper foil substrate can be manufactured but also a substrate with a thickness of 100 μm can be easily obtained.

The above description of the present invention is only an outline of the technical solution of the present invention. In order to provide clearer understanding of the technical means of the present invention such that the present invention can be carried out in accordance with the contents of the specification, a preferred embodiment of the present invention will be described below with reference to the accompanying drawings.

Figure 1:
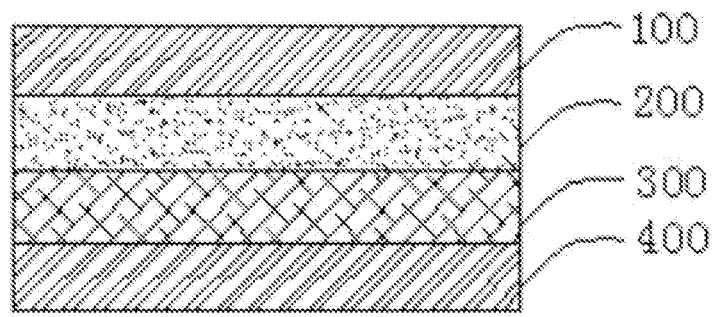
FIG. 1 is a structural schematic diagram of the present invention where there is only one LCP core layer.

The parts in the drawings are labeled as follows:
100—first copper foil layer, 200—LCP core layer, 201—first LCP core layer, 202—second LCP core layer, 300—extremely low dielectric adhesive layer, and 400—second copper foil layer.

DETAILED DESCRIPTION OF THE INVENTION

The advantages and effects of the present invention will be readily apparent to those skilled in the art by illustrating the specific embodiments of the present invention. Further, the present invention can be implemented in other different ways. That is to say, modifications and variations can be made without departing from the scope of the present invention.

Figure 2:
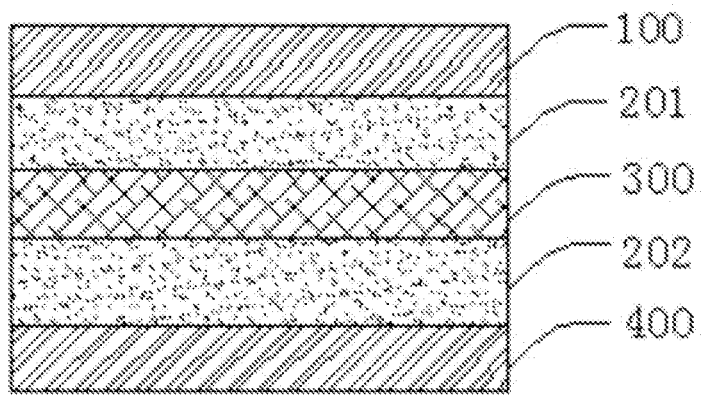
FIG. 2 is another one of the structural schematic diagram of the present invention where there are two LCP core layer.

Embodiment: A composite LCP high-frequency high-speed double-sided copper foil substrate, as shown in FIG. 1 and FIG. 2, includes at least one LCP core layer, at least one extremely low dielectric adhesive layer, and two copper foil layers.

The LCP core layer and the extremely low dielectric adhesive layer are located between the two copper foil layers.

The thickness of each LCP core layer is 5-50 μm. The thickness of each extremely low dielectric adhesive layer is 2-50 μm. The thickness of each copper foil layer is 1-35 μm.

Preferably, the thickness of each LCP core layer is 12.5-50 μm, the thickness of each extremely low dielectric adhesive layer is 12.5-50 μm, and the thickness of each copper foil layer is 6-18 μm.

The double-sided copper foil substrate has one of two structures as below.

The first structure comprises a LCP core layer 200, an extremely low dielectric adhesive layer 300, a first copper foil layer 100, and a second copper foil layer 400. The LCP core layer is located between the first copper foil layer and the extremely low dielectric adhesive layer. The extremely low dielectric adhesive layer is located between the second copper foil layer and the LCP core layer. The total thickness of the LCP core layer, the extremely low dielectric adhesive layer, the first copper foil layer, and the second copper foil layer is 9-170 μm, as shown in FIG. 1.

The second structure comprises a first LCP core layer 201, an extremely low dielectric adhesive layer 300, a second LCP core layer 202, a first copper foil layer 100, and a second copper foil layer 400. The first LCP core layer is located between the first copper foil layer and the extremely low dielectric adhesive layer. The extremely low dielectric adhesive layer is located between the first LCP core layer and the second LCP core layer, the second LCP core layer is located between the extremely low dielectric adhesive layer and the second copper foil layer. The total thickness of the first LCP core layer, the extremely low dielectric adhesive layer, the second LCP core layer, the first copper foil layer, and the second copper foil layer is 14-220 μm, as shown in FIG. 2.

The extremely low dielectric adhesive layer 300 is an adhesive layer having a Dk (Dielectric constant) value of 2.0 to 3.0 (10 GHz) and a Df (Dielectric loss factor) value of 0.002 to 0.010 (10 GHz).

Preferably, the extremely low dielectric adhesive layer is an adhesive layer having a Dk value of 2.2 to 3.0 (10 GHz).

Each copper foil layer is a low-profile copper foil layer having an Rz (surface roughness) value of 0.4 to 1.0 μm. The Rz value of a surface of the copper foil layer that is attached to the LCP core layer is 0.4 to 1.0 μm. The Rz value of an outer surface of the copper fail layer is 0.4 to 0.7 μm. Each copper foil layer is a rolled copper foil layer (RA/HA/HAV2) or an electro deposited copper layer (ED).

The Rz value of the surface of the copper foil layer that is attached to the LCP core layer may be 0.4 µm, 0.5 µm, 0.6 µm, 0.7 µm, 0.8 µm, 0.9 µm or 1.0 µm, and the Rz value of the outer surface of the copper foil layer may be 0.4 µm, 0.5 µm, 0.6 µm or 0.7 µm.

The water absorption of the LCP core layer is 0.01-0.1%. The water absorption of the extremely low dielectric adhesive layer is 0.01-0.1%. The overall water absorption of the double-sided copper foil substrate is 0.01-0.5%. The bonding strength of the extremely low dielectric adhesive layer is more than 0.7 kgf/cm$^2$.

Preferably, the water absorption of the LCP core layer is 0.01-0.04%. The water absorption of the extremely low dielectric adhesive layer is 0.01-0.08%. The overall water absorption of the double-sided copper foil substrate is 0.01-0.1%.

The resin material of the extremely low dielectric adhesive layer is at least one selected from the group consisting of fluorine-based resin, epoxy resin, acrylic resin, amine-based formate-based resin, silicone rubber-based resin, poly-p-xylene based resin, bismaleimide-based resin, and polyimide resin.

The extremely low dielectric adhesive layer 300 includes fused silicon dioxide, teflon, fluorine-based resin, phosphorus-based heat-resistant agent, and polyimide resin. The sum of the ratio of each of the fused silicon dioxide, the teflon, the fluorine-based resin, and the phosphorus-based heat-resistant agent to the total solid content is 8 to 50% by weight. The proportion of the polyimide resin is 40% to 90% by weight.

The ratio of the fused silicon dioxide to the total solid content is 2 to 15% by weight. The ratio of the teflon to the total solid content is 2 to 10% by weight. The ratio of the fluorine-based resin to the total solid content is 2 to 10% by weight. The ration of the phosphorus-based heat-resistant agent to the total solid content is 2 to 15% by weight.

A preparation method of the composite LCP high-frequency high-speed double-sided copper foil substrate is one of two methods listed as below.

The first method includes the following steps.

Step 1, a LCP varnish (e.g., Sumitomo Chemical. VR400) is coated on one side of the first copper foil layer, and a solvent is removed at 60-100° C. firstly, and then a condensation reaction is conducted at 300° C. for 10 hours, such that the LCP core layer is generated.

Step 2, an extremely low dielectric adhesive is coated on a surface of the LCP core layer, and the LCP core layer is dried to obtain the extremely low dielectric adhesive layer.

Step 3, pressing the second copper foil layer on a surface of the extremely low dielectric adhesive layer, and the pressing temperature is 50-130° C.

Step 4, winding and curing are conducted to obtain a finished product.

The second method includes the following steps.

Step 1, the LCP varnish (e.g., Sumitomo Chemical. VR400) is coated on one side of the first copper foil layer, and the solvent is removed at 60-100° C., and then condensation reaction is conduct at 300° C. for 10 hours to generate the first LCP core layer.

Step 2, the extremely low dielectric adhesive is coated on the surface of the first LCP core layer, and drying is conducted to obtain the extremely low dielectric adhesive layer.

Step 3, the LCP varnish of the step 1 is coated on the extremely low dielectric adhesive layer, and the solvent is removed at 60-100° C. firstly, and then a condensation reaction is conducted at 300° C. for 10 hours, such that the second LCP core layer is generated.

Step 4, the second copper foil layer is pressed on a surface of the second LCP core layer, and the pressing temperature is 50-130° C.

Step 5, winding and curing are conducted to obtain a finished product.

Embodiment 1 and embodiment 4 use the first method to prepare, and embodiment 2, embodiment 3, and embodiment 5 use the second method to prepare.

In the embodiment of the present invention, weight percentage content of each of fused silicon dioxide, teflon, fluorine-based resin, phosphorus-based heat-resistant agent, and polyimide resin in the extremely low dielectric adhesive layer are shown in the table 1.

TABLE 1

| | fused silicon dioxide (%) | teflon (%) | fluorine-based resin (%) | phosphorus-based heat-resistant agent (%) | polyimide resin (%) |
|---|---|---|---|---|---|
| Embodiment 1 | 2 | 2 | 2 | 2 | 90 |
| Embodiment 2 | 8 | 10 | 6 | 10 | 60 |
| Embodiment 3 | 15 | 10 | 10 | 15 | 40 |
| Embodiment 4 | 2 | 7 | 3 | 3 | 80 |
| Embodiment 5 | 6 | 8 | 7 | 10 | 65 |

The fundamental performance of the embodiments of the present invention compared with the existing LCP substrate and PI substrate are shown in the table 2 and the table 3.

TABLE 2

| items | Film thickness (µm) first copper foil layer | Film thickness (µm) extremely low dielectric adhesive layer | Film thickness (µm) LCP The first LCP core layer | Film thickness (µm) LCP The second LCP core layer | Film thickness (µm) The second copper foil layer | Rz (µm) The first and second copper foil layer | water absorption at room temperature for 24 hr | Loss of high speed transmission signals dB (10 GHz) | Bonding strength (kgf/cm2) | Spring force before coating film (g) | Spring force after coating film (g) |
|---|---|---|---|---|---|---|---|---|---|---|---|
| Embodiment 1 | 1 | 2 | 5 | | 1 | 0.4 | 0.05 | 5.28 | 0.7 | 5.8 | 15.6 |
| Embodiment 2 | 6 | 10 | 5 | 5 | 6 | 0.5 | 0.07 | 5.06 | 0.82 | 6.3 | 16.7 |
| Embodiment 3 | 12 | 12.5 | 12.5 | 12.5 | 12 | 0.6 | 0.06 | 5.79 | 0.83 | 6.5 | 17.1 |
| Embodiment 4 | 18 | 25 | 25 | | 18 | 0.7 | 0.06 | 5.82 | 1.11 | 10.6 | 18.2 |
| Embodiment 5 | 35 | 50 | 50 | 50 | 35 | 1 | 0.06 | 5.9 | 1.75 | 14.7 | 20.5 |

TABLE 2-continued

| items | Film thickness (μm) | | | | | | Rz (μm) The first and second copper foil layer | water absorption at room temperature for 24 hr | Loss of high speed transmission signals dB (10 GHz) | Bonding strength (kgf/cm2) | Spring force before coating film (g) | Spring force after coating film (g) |
|---|---|---|---|---|---|---|---|---|---|---|---|---|
| | first copper foil layer | extremely low dielectric adhesive layer | The first LCP core layer | The second LCP core layer | The second copper foil layer | | | | | | | |
| Comparative example 1 | | | Normal PI substrate | | | | | 1.3 | 9.45 | 0.83 | 18.6 | 35.8 |
| Comparative example 2 | | | Normal PI substrate | | | | | 1.8 | 11.46 | 0.85 | 19.4 | 37.3 |
| Comparative example 3 | | | Normal LCP substrate | | | | | 0.04 | 6.14 | 0.65 | 18.3 | 35.4 |
| Comparative example 4 | | | Normal LCP substrate | | | | | 0.06 | 6.44 | 0.71 | 19.9 | 38.6 |

TABLE 3

| items | Dk (10 GHz) | | | Df (10 GHz) | | | solder resistance |
|---|---|---|---|---|---|---|---|
| | Before immersion in water at room temperature | After immersion in water at room temperature for 24 hours | Change Rate (%) | Before immersion in water at room temperature | After immersion in water at room temperature for 24 hours | change rate (%) | |
| Embodiment 1 | 2.31 | 2.30 | −0.43 | 0.0027 | 0.0030 | 11.11 | 300° C.*10 S pass |
| Embodiment 2 | 2.26 | 2.23 | −1.3 | 0.0032 | 0.0036 | 12.50 | 300° C.*10 S pass |
| Embodiment 3 | 2.31 | 2.30 | −0.43 | 0.0027 | 0.0030 | 11.11 | 300° C.*10 S pass |
| Embodiment 4 | 2.34 | 2.32 | −0.85 | 0.0028 | 0.0031 | 10.71 | 300° C.*10 S pass |
| Embodiment 5 | 2.33 | 2.31 | −0.86 | 0.0028 | 0.0031 | 10.71 | 300° C.*10 S pass |
| Comparative Example 1 | 3.71 | 3.50 | −5.67 | 0.0213 | 0.0300 | 40.85 | 300° C.*10 S pass |
| Comparative Example 2 | 3.97 | 3.66 | −7.81 | 0.0245 | 0.0356 | 45.31 | 300° C.*10 S pass |
| Comparative Example 3 | 2.3 | 2.30 | 0.00 | 0.0025 | 0.0026 | 4.00 | 288° C.*10 S pass |
| Comparative Example 4 | 2.34 | 2.33 | −0.43 | 0.0026 | 0.0028 | 7.69 | 288° C.*10 S pass |

Notes:
the test method of the performance of the table 2 and the table 3 complies with testing criterion of outline for flexible board assembly (TPCA-F-002).

It can be known from the table 2 and the table 3, the present invention has a better performance in water absorption and high-speed transmission than that of the general PI substrate and is equivalent to LCP substrate. At the same time, the present invention can solve the deficiencies of the LCP, TPI, such as high requirement to equipment, high operating temperature limitation of process technology, expensive cost, strong spring force, poor workability.

The composite LCP high-frequency high-speed double-sided copper foil substrate of the present invention has excellent high-speed transmission property, good solder resistance, stable dk/df performance in high temperature and humid environment, ultra-low water absorption, good UV laser drilling capacity, low spring force suitable for high density assembly, and excellent mechanical properties.

The present invention is superior to LCP film and ordinary PI type bonding sheet, and is suitable for wearable equipment such as 5G smart phone and Apple watch (smart watch).

The above are merely embodiments of the present invention and are not intended to limit the scope of the present invention. The equivalents based on the specification and drawings of the present invention, or using either directly or indirectly in other relevant technical field, are within the scope of the scope of the present invention.

What is claimed is:
1. A composite liquid crystalline polymer (LCP) high-frequency high-speed double-sided copper foil substrate, comprising layers in the following order:
   a first copper foil layer;
   a liquid crystalline polymer (LCP) core layer;
   a low dielectric adhesive layer;
   a second copper foil layer; and
   wherein a thickness of the LCP core layer is 22.5-50 μm,
   a thickness of the low dielectric adhesive layer is 12.5-50 μm,
   a thickness of each of the first and second copper foil layers is 1-35 μm,
   a Dk value of the low dielectric adhesive layer is between 2.8 to 3.0 (10 GHz) and
   a Df value of the low dielectric adhesive layer is 0.01 (10 GHz).

2. The composite LCP high-frequency high-speed double-sided copper foil substrate according to claim 1, wherein a total thickness of the LCP core layer, the low dielectric adhesive layer, the first copper foil layer, and the second copper foil layer is 37-170 µm.

3. The composite LCP high-frequency high-speed double-sided copper foil substrate according to claim 1, wherein the double-sided copper foil substrate further comprises:
a second LCP core layer located between the low dielectric adhesive layer and the second copper foil layer;
wherein a total thickness of the LCP core layer, the low dielectric adhesive layer, the second LCP core layer, the first copper foil layer, and the second copper foil layer is 42-220 µm.

4. The composite LCP high-frequency high-speed double-sided copper foil substrate according to claim 1, wherein each copper foil layer is a low-profile copper foil layer having an Rz value of 0.4 to 1.0 µm, and an Rz value of a surface of the copper foil layer that is attached to the LCP core layer is 0.4 to 1.0 µm, and an Rz value of an outer surface of the copper foil layer is 0.4 to 0.7 µm; and each copper foil layer is a rolled copper foil layer or an electro deposited copper layer.

5. The composite LCP high-frequency high-speed double-sided copper foil substrate according to claim 1, wherein
a water absorption of the LCP core layer is 0.01-0.1%;
a water absorption of the low dielectric adhesive layer is 0.01-0.1%;
an overall water absorption of the double-sided copper foil substrate is 0.01-0.5%, and a bonding strength of the low dielectric adhesive layer is more than 0.7 kgf/cm$^2$.

6. The composite LCP high-frequency high-speed double-sided copper foil substrate according to claim 1, wherein a resin material of the low dielectric adhesive layer is at least one selected from the group consisting of fluorine-based resin, epoxy resin, acrylic resin, amine-based formate-based resin, silicone rubber-based resin, poly-p-xylene based resin, bismaleimide-based resin, and polyimide resin.

7. The composite LCP high-frequency high-speed double-sided copper foil substrate according to claim 1, wherein the low dielectric adhesive layer comprises fused silicon dioxide, Teflon, fluorine-based resin, phosphorus-based heat-resistant agent and polyimide resin; and all of the fused silicon dioxide, the Teflon, the fluorine-based resin, and the phosphorus-based heat-resistant agent is 8% to 50% of total solid content by weight; a proportion of the polyimide resin is 40 to 90% by weight.

8. The composite LCP high-frequency high-speed double-sided copper foil substrate according to claim 7, wherein
the fused silicon dioxide is 2 to 15% of the total solid content by weight, the Teflon is 2 to 10% of the total solid content by weight,
the fluorine-based resin is 2 to 10% of the total solid content by weight, the phosphorus-based heat-resistant agent is 2 to 15% of the total solid content by weight.

9. The composite LCP high-frequency high-speed double-sided copper foil substrate according to claim 5, wherein
the water absorption of the LCP core layer is 0.01-0.04%;
the water absorption of the low dielectric adhesive layer is 0.01-0.08%;
the overall water absorption of the double-sided copper foil substrate is 0.01-0.1%.

10. A method of preparing the composite LCP high-frequency high-speed double-sided copper foil substrate of claim 1, comprising the following steps:
1) coating a LCP varnish on one side of a first copper foil layer, and then removing a solvent at 60-100° C., and then conducting condensation reaction at 300° C. for 10 hours to generate a LCP core layer;
2) coating an extremely low dielectric adhesive on a surface of the LCP core layer, and conducting drying to obtain an extremely low dielectric adhesive layer;
3) pressing a second copper foil layer on a surface of the extremely low dielectric adhesive layer; and
4) conducting winding and curing to obtain a finished product.

11. A method of preparing the composite LCP high-frequency high-speed double-sided copper foil substrate of claim 1, comprising the following steps:
1) coating a LCP varnish on one side of a first copper foil layer, and then removing a solvent at 60-100° C., and then conducting condensation reaction at 300° C. for 10 hours to generate a first LCP core layer;
2) coating an extremely low dielectric adhesive on a surface of the first LCP core layer, and conducting drying to obtain an extremely low dielectric adhesive layer;
3) coating the LCP varnish in the step 1) on the extremely low dielectric adhesive layer, and then removing the solvent at 60-100° C., and then conducting condensation reaction at 300° C. for 10 hours to generate a second LCP core layer;
4) pressing the second copper foil layer on a surface of the second LCP core layer; and
5) conducting winding and curing to obtain a finished product.

12. The composite LCP high-frequency high-speed double-sided copper foil substrate according to claim 1, wherein
the thickness of the low dielectric adhesive layer is 15-50 µm and
the thickness of each of the first and second copper foil layers is 1-5 µm.

13. The composite LCP high-frequency high-speed double-sided copper foil substrate according to claim 1, wherein
the thickness of the low dielectric adhesive layer is 15-50 µm and
the thickness of each of the first and second copper foil layers is 20-35 µm.

* * * * *